United States Patent [19]

Oswald, Jr.

[11] Patent Number: 4,461,785
[45] Date of Patent: Jul. 24, 1984

[54] PROCESS FOR ELECTRICAL TERMINAL CONTACT METALLIZATION

[75] Inventor: Joseph A. Oswald, Jr., Mechanicsburg, Pa.

[73] Assignee: E. I. Du Pont de Nemours and Company, Wilmington, Del.

[21] Appl. No.: 442,956

[22] Filed: Nov. 19, 1982

[51] Int. Cl.³ ............................................. B05D 3/02
[52] U.S. Cl. ..................................... 427/45.1; 427/46; 427/88; 427/125
[58] Field of Search .................. 427/45.1, 88, 125, 46; 219/7.5, 10.43, 9.5, 10.69

[56] References Cited

U.S. PATENT DOCUMENTS

| | | | |
|---|---|---|---|
| 2,865,794 | 12/1958 | Kroger et al. | 427/88 X |
| 4,146,957 | 4/1979 | Toenshoff | 427/125 X |
| 4,219,448 | 8/1980 | Ross | 427/88 X |
| 4,235,944 | 11/1980 | Felten | 427/125 |
| 4,278,702 | 7/1981 | Jenq | 427/45.1 |

Primary Examiner—Thurman K. Page

[57] ABSTRACT

Forming a layer of a noble metal on a contact by screen printing a thick film noble metal paste on a predetermined area of terminal metal flat strip stock. The paste is heated on the strip stock using an induction heating coil.

7 Claims, 3 Drawing Figures

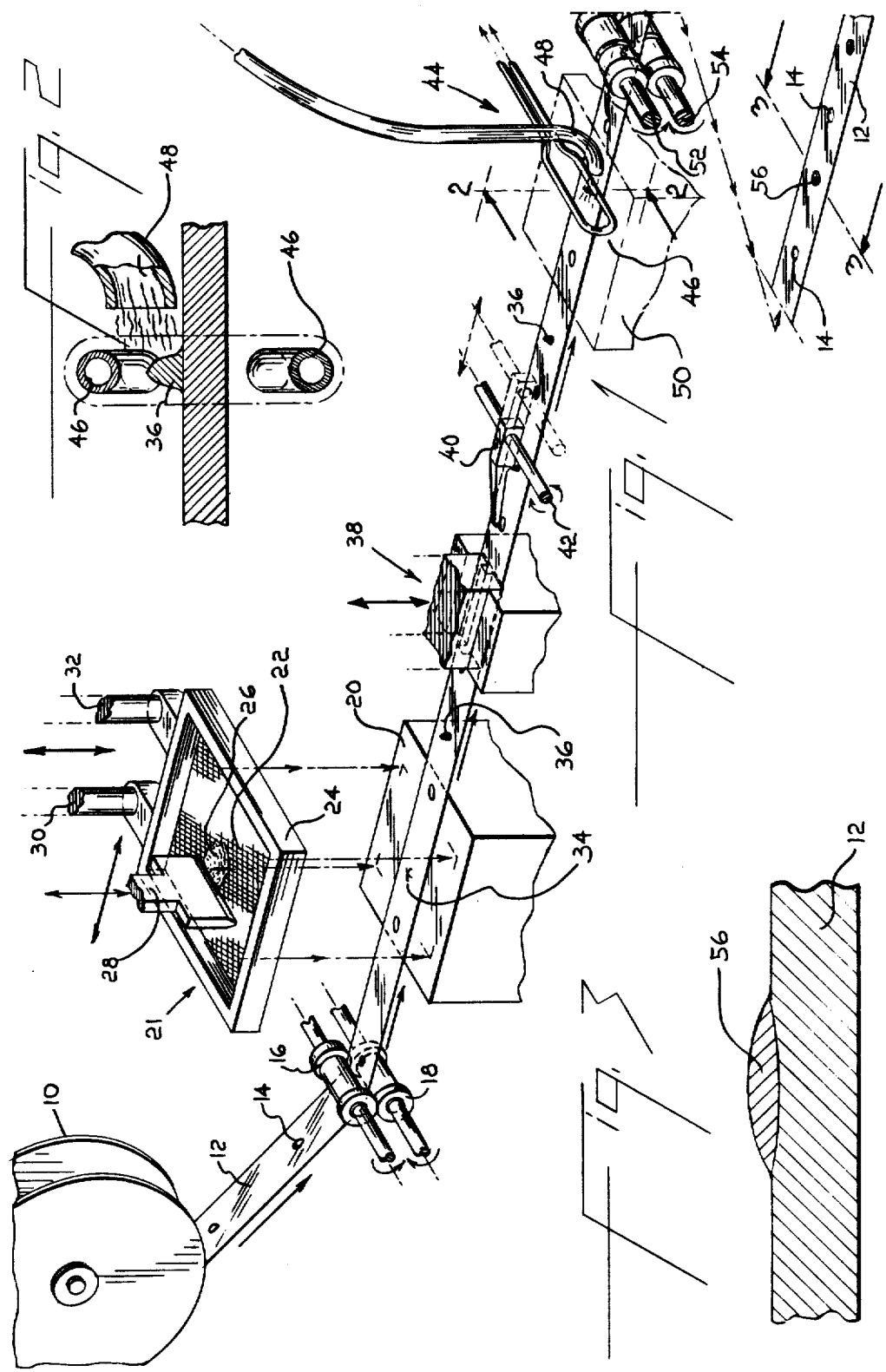

PROCESS FOR ELECTRICAL TERMINAL CONTACT METALLIZATION

DESCRIPTION

1. Technical Field

This invention relates to a process for metallizing a terminal contact. More specifically, it relates to a process for applying a thin layer of conductive paste containing finely divided gold or other noble metal particles on an electrical terminal contact surface.

2. Background of the Invention

The common practice of gold plating electrical terminals produces quality products which are free from formation of oxidation films in contact areas. Unfortunately, the high cost of gold makes this practice too expensive for most electrical terminals. One way of reducing this cost is the use of spot welding of a small piece of gold wire to the contact zone of the terminal. This confines the use of the costly gold to the actual contact area. However, it has been found that a thicker deposit of gold is produced using this welding process than is required for contact functionality. Another like process to conserve gold is described in U.K. No. 2,071,703A wherein light beams produced by means of ruby lasers are used to fuse gold pastes to substrates. This process cannot work effectively unless sufficient light energy is employed to heat and melt the gold and the subsurface. By unduly melting the subsurface, an undesirable alloy can be formed with the gold. This reduces the functionality of the contact area. Furthermore, laser processing requires thorough drying of the paste before sintering, close control of paste and substrate reflectivity, and significant capital cost for a laser and its attendant safety equipment.

SUMMARY OF THE INVENTION

I have invented a process for controlling the amount of noble metal placed on a contact area of a metal strip stock used for making terminals without the need to employ laser systems. This method provides contact areas with layers of noble metal as thin as 0.01 to 0.04 mm. My process is carried out by feeding strip metal stock through a screen printing zone where a thick film noble metal metallization composition is applied to a precalculated spot on the metal stock. Thereafter, the metal stock containing the thick film composition is fed into an induction heating coil where the thick film composition is heated to a temperature between 700° and 900° C. in the presence of an inert gas, preferably nitrogen, for about one second. The strip metal stock can then be formed into a terminal which will contain the noble metal on the appropriate predetermined contact zone.

BRIEF DESCRIPTION OF THE DRAWINGS

The present invention may be best understood by those having ordinary skill in the art by reference to the following detailed description when considered in conjunction with the accompanying drawings in which:

FIG. 1 is a stylized perspective view of the process;

FIG. 2 is a sectional view of the induction heating zone; and

FIG. 3 is a sectional view of the metal strip stock with a melted noble metal layer formed on its surface.

DETAILED DESCRIPTION OF THE PREFERRED EMBODIMENT

Referring to FIG. 1, the process is depicted beginning with the raw strip stock 12 coming out from a storage wheel 10. The strip stock 12 has prepunched pilot holes 14. The strip stock 12 moves through a pair of roller guides 16 and 18 over a guide block 20. As the strip stock 12 moves over the guide block 20, a screen printer 21 places a small amount of gold composition 26 on the target zone 34.

The screen printer 21 employs a stainless steel screen 22 mounted in a frame support 24. Gold paste composition 26 is placed on the screen 22, and by means of a squeegee 28, the gold paste 26 is deposited onto the target area 34. A pair of guide rod supports 30 and 32 move the screen printer 21 up and down over the strip stock 12.

The strip stock employed in this process is material customarily used for making electrical terminals; usually cupro nickel, phosphor bronze, brass, and various other alloys of copper, nickel plated.

The gold composition 26 is made by mixing fine particles of gold (1-10 microns) with other inorganic solid particles such as cadmium/antimony alloy and an inert liquid vehicle. The inorganic solid added to the gold provides a composition that adheres readily to the metal stirp stock. The preferred composition contains 65-97% by weight of finely divided gold particles and 3-25% by weight of cadmium/antimony alloy, based on the total weight of the composition. Small amounts of copper or silver could also be present. The amount of liquid vehicle such as an ethyl cellulose resin can vary. Usually, it should be added to the inorganic solids until a thick printable paste forms. Normally, to make a printable paste, there is 60-95% by weight inorganic powder and 5-40% by weight vehicle. A description of techniques for thick film pastes useful in this invention can be found in "Handbook of Materials and Processes for Electronics", C. A. Harper, Editor, McGraw Hill, N.Y. 1970, Chapter 12.

Other noble metals such as silver, palladium, platinum, and alloys of these noble metals also can be made into compositions for screen printing onto the metal substrate using my process.

Continuing on with the process described in FIG. 1, the wet gold paste composition layer 36 is shown on the strip stock 12 after passing over the guide block 20. The strip stock containing the gold paste composition 36 subsequently passes through a centering device 38 and then under an indexer 40 supported on a shaft 42. The gold composition 36 on the strip stock 12 then passes through the paste heater 44 in about one second. The heater 44 employs an induction heating coil 46 at a preferred temperature of 700°-900° C. to heat the gold paste composition 36 in the presence of an inert gas such as nitrogen, supplied by hose 48. The temperature, time and coil design causes the composition 36 to adhere to the substrate.

A support block 50 is employed for the paste heater 44. As the strip stock emainates from the paste heater 44, it passes between a pair of tension rollers 52 and 54. After passing through these rollers, the desired melted paste composition 56 is noted on the strip stock 12. This paste composition 56 is approximately 0.01 to 0.04 mm thick on the metal substrate 12, as seen in FIG. 3.

Having thus described the invention, what is claimed and desired to be secured by Letters Patent is:

1. Process for forming a noble metal contact area on metal stock suitable for forming into an electrical terminal comprising feeding the metal stock through a screen printing zone where a thick film noble metallization paste composition is applied to a predetermined position on the metal stock and thereafter feeding the metal stock into an induction heating coil where the metallization composition on the metal stock is heated in the presence of an inert gas.

2. Process according to claim 1 wherein the noble metal is gold.

3. Process according to claim 1 wherein the noble metal is silver.

4. Process according to claim 1 wherein the noble metal is palladium.

5. Process according to claim 1 wherein the noble metal is an alloy of a noble metal.

6. Process according to claim 1 wherein the noble metal is gold, and the thick film paste composition contains 65 to 97% by weight finely divided gold particles and 3 to 25% by weight of finely divided particles of an alloy of cadmium and antimony based on the total inorganic solids present, and sufficient inert liquid vehicle to form a paste.

7. Process according to claims 1 or 6 wherein the induction heating is carried out for about one second at a temperature between 700 and 900° C. in the presence of nitrogen.

* * * * *